(12) United States Patent
Kruip

(10) Patent No.: US 7,167,004 B1
(45) Date of Patent: Jan. 23, 2007

(54) OPEN MRI MAGNET ASSEMBLY WITH PAIRED PLANAR DRIVING COILS HAVING OPPOSITE CURRENT FLOWS AND A RACETRACK, NESTED, OR SUBSTANTIALLY-PLANAR MULTI-COIL SHAPE

(75) Inventor: Marcel Jan Marie Kruip, Oxfordshire (GB)

(73) Assignee: Oxford Magnet Technology Limited, Witney (GB)

( * ) Notice: Subject to any disclaimer, the term of this patent is extended or adjusted under 35 U.S.C. 154(b) by 336 days.

(21) Appl. No.: 10/111,444

(22) PCT Filed: Oct. 12, 2000

(86) PCT No.: PCT/GB00/03914

§ 371 (c)(1),
(2), (4) Date: Aug. 27, 2002

(87) PCT Pub. No.: WO01/31358

PCT Pub. Date: May 3, 2001

(30) Foreign Application Priority Data

Oct. 26, 1999 (GB) .................................. 9925171.2

(51) Int. Cl.
*G01V 3/00* (2006.01)
*G01R 33/38* (2006.01)
(52) U.S. Cl. ...................... 324/320; 324/319; 324/318; 335/299; 335/301; 335/296
(58) Field of Classification Search ................ 600/410, 600/411, 420; 324/300–322
See application file for complete search history.

(56) References Cited

U.S. PATENT DOCUMENTS

| 4,339,718 | A | | 7/1982 | Bull et al. ................... 324/319 |
| 4,486,711 | A | * | 12/1984 | Frese et al. .................. 324/319 |
| 4,755,755 | A | * | 7/1988 | Carlson ....................... 324/319 |
| 5,198,769 | A | * | 3/1993 | Frese et al. .................. 324/318 |
| 5,708,362 | A | | 1/1998 | Frese et al. .................. 324/319 |
| 5,744,960 | A | * | 4/1998 | Pulyer ........................ 324/320 |
| 5,764,059 | A | * | 6/1998 | Mansfield et al. ........... 324/318 |
| 5,786,694 | A | * | 7/1998 | Kilian et al. ................. 324/318 |
| 6,208,142 | B1 | * | 3/2001 | Wagshul ...................... 324/319 |
| 6,288,624 | B1 | * | 9/2001 | Savelainen ................... 335/299 |
| 6,853,281 | B1 | * | 2/2005 | Kakugawa et al. ......... 335/296 |

FOREIGN PATENT DOCUMENTS

WO    WO 9927851 A1 *  6/1999

\* cited by examiner

*Primary Examiner*—Diego Gutierrez
*Assistant Examiner*—Tiffany A. Fetzner
(74) *Attorney, Agent, or Firm*—Crowell & Moring LLP

(57) ABSTRACT

The present invention provides a magnet assembly (30*a*, 30*b*) comprising a pair of drive coils (31*a*, 31*b*; 32*a*, 32*b*; 33*a*, 33*b*) symmetrically disposed with respect to a reference plane. The reference plane is located approximately equidistant between the drive coils. Each of the drive coils has a current flowing through it which is in the opposite sense to the current flowing through the other drive coil, such that a primary magnetic field is generated in a plane which is parallel to and substantially coincident with the reference plane. The assembly may comprise further compensating coils (44*a*, 45*a*, 46*a*) which are configured to generate a magnetic field to improve homogeneity of the primary magnetic field. The drive coils and the compensating coils are generally in the shape of a racetrack and are preferably superconducting coils.

14 Claims, 5 Drawing Sheets

OPEN MRI MAGNET ASSEMBLY WITH PAIRED PLANAR DRIVING COILS HAVING OPPOSITE CURRENT FLOWS AND A RACETRACK, NESTED, OR SUBSTANTIALLY-PLANAR MULTI-COIL SHAPE

The present invention relates to a magnet with improved access. More specifically, the present invention relates to a magnet for use in a magnetic resonance imaging (MRI) system which allows improved access to the patient.

A magnetic field with a high degree of homogeneity is essential for the successful application of a number of analytical techniques, in particular MRI. These fields can be generated by a number of devices, such as coil magnets or permanent magnets, or a combination of the two. Ferromagnetic material is known to be used, in addition to the above mentioned magnets, to increase the field strength, improve field homogeneity, and to limit stray magnetic fields.

Most known MRI magnets consist of an assembly of coaxial superconducting coils. These coils are positioned in such a way that the required field strength and homogeneity is achieved. The patient is positioned inside the coils with the head-feet axis in line with the axis of the coils. FIG. 1 is an example of this type of MRI system, which is known in the art as the solenoid configuration. In FIG. 1 a cross section through the solenoid type MRI system 10 is shown comprising a pair of drive coils 12a, 12b, which function to generate the primary magnetic field $\vec{B}$ along the central line Z of the system. A plurality of compensating coils 13a, 13b, 13c, 13d are used to improve the homogeneity of the primary magnetic field. The patient 15 is located along the centre line Z of the system.

A disadvantage of the solenoid configuration shown in FIG. 1 is that the patient has to be located inside a tube. This can cause the patient stress and make him feel trapped. Furthermore, access to the patient once he is inside the tube is limited.

An object of the present invention is to provide a magnet which generates a magnetic field suitable for use in an MRI system and which allows improved access to the patient and which causes the patient less stress.

According to the present invention there is provided a magnet assembly for use in an MRI system comprising a pair of drive coils, each of said pair of drive coils being substantially the same size and shape and symmetrically disposed with respect to a reference plane, the reference plane being located between said pair of drive coils, each of said pair of drive coils being arranged such that a current flows there through, the current through the first drive coil of said pair being in an opposite sense to the current through the second drive coil of said pair, such that a primary magnetic field is generated in a plane which is parallel to and substantially coincident with the reference plane.

According to an aspect of the present invention, the magnet assembly further comprises a pair of compensating coils, each of said pair of compensating coils being substantially the same size and shape and arranged such that a current flows there through, the current through the first compensating coil of said pair of compensating coils being in the opposite sense to the current through the first drive coil, and the current through the second compensating coil of said pair of compensating coils being in the opposite sense to the current through the second drive coil, such that a compensating magnetic field is generated in a plane which is parallel to and substantially coincident with the reference plane and which functions to compensate for inhomogeneity in the primary magnet field.

According to a further aspect, the first drive coil and the first compensating coil are disposed in a first plane, and the second drive coil and the second compensating coil are disposed in a second plane.

According to yet a further aspect, the reference plane is approximately equidistant between the first and the second planes.

According to yet a further aspect, the pair of drive coils and the pair of compensating coils are superconducting coils.

According to yet a further aspect, the assembly comprises a plurality of pairs of drive coils.

According to yet a further aspect, the assembly comprises a plurality of pairs of compensating coils.

While the principle advantages and features of the invention have been described above, a greater understanding and appreciation of the invention may be obtained by referring to the drawings and detailed description of the preferred embodiment, presented by way of example only, in which.

Figure 1:
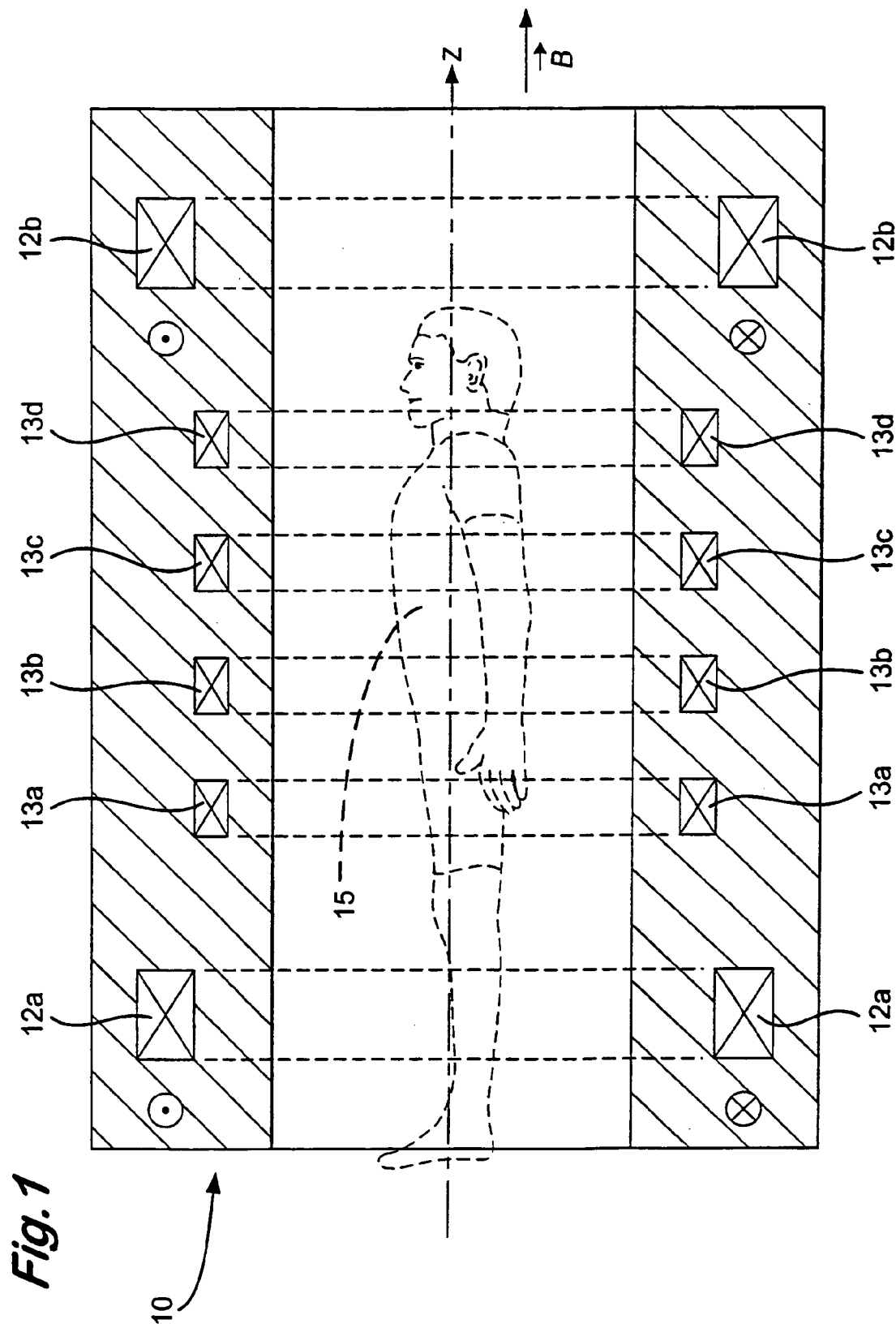
Figure 2:
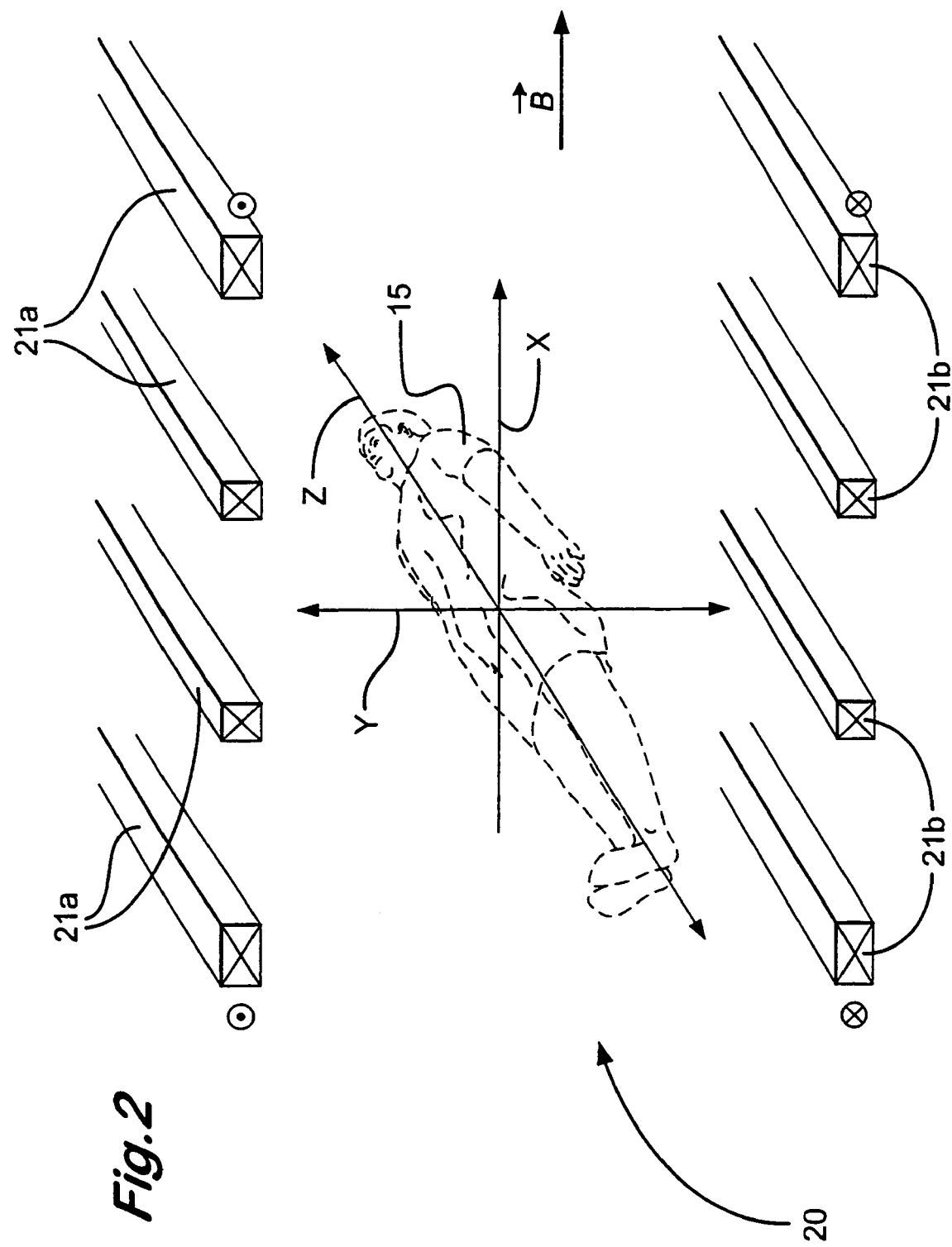
FIG. 2 is a cross section through a hypothetical two dimensional magnet.

In FIG. 2 a cross section through a hypothetical two dimensional magnet 20 is shown comprising conductors 21a and 21b, which are symmetrically disposed with respect to a reference plane X-Z. The reference plane in located approximately equidistant between the conductors. Theoretically, conductors which are infinitely long would generate a primary magnetic field $\vec{B}$ in a plane corresponding to the reference plane and perpendicular to the head-foot axis of patient 15.

However, conductors with a finite length and disposed with the same vertical spacing Y between them can generate a magnetic field with the same imaging quality as can theoretically be achieved with the infinitely long conductors. This results in a MRI system with much-improved openness.

A good approximation of the ideal, infinitely long two-dimensional magnet shown in FIG. 2 can be achieved by truncating the length of the conductors and providing a return path for the currents that is substantially away from the imaging region of the system.

Figure 3:
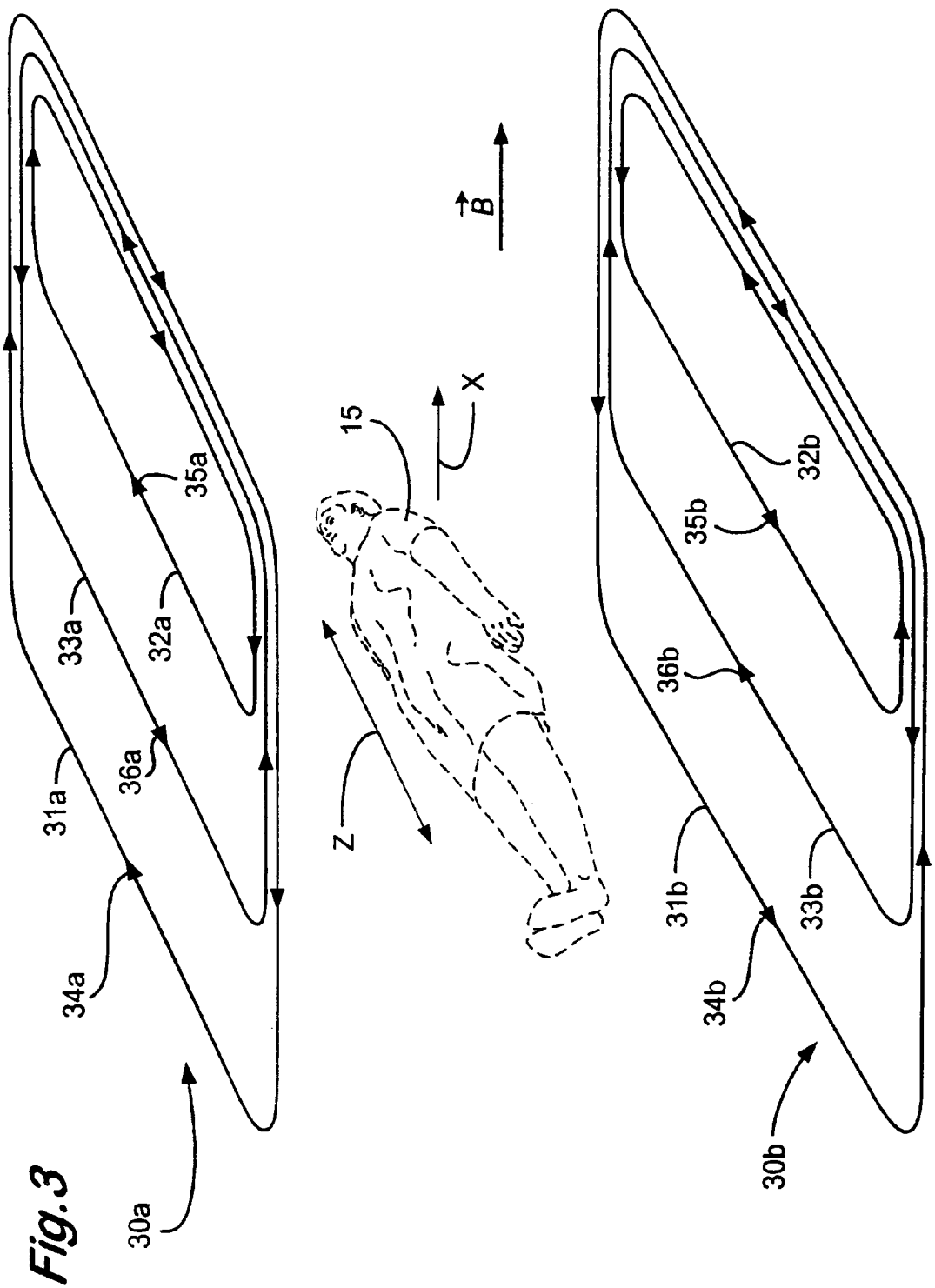
FIG. 3 is a side view of a pair of improved access magnetic coil assemblies according to the present invention.

In FIG. 3 a pair of improved access magnetic coil assemblies 30a, 30b are shown. Each assembly consists of three pairs of racetrack coils 31a & 31b, 32a & 32b, and 33a & 33b. The term racetrack coil is well known in the art and refers to coils that contain both arc and straight sections and are generally rectangular or oval shaped. However, as will be appreciated by those skilled in the art, other shaped coils could be used. A patient 15 is located between the pair of magnet assemblies 30a, 30b. Each racetrack coils 31a, 32a, 33a in magnet assembly 30a above the patient is matched by a racetrack coil 31b, 32b, 33b in the magnet assembly 30b below the patient. Coils 31a, 32a, 33a are substantially the same size and shape as coils 31b, 32b, 33b. Coils 31a, 32a, 33a have a current running through them which is in the opposite sense to a current running through corresponding coils 31b, 32b, 33b. Thus for example, racetrack coil 31a has a current running in the direction indicated by arrow 34a and the corresponding racetrack coil 31b has a current running in the opposite sense as indicated by arrow 34b. Each corresponding pair of racetrack coils: 31a & 31b, 32a & 32b, and 33a & 33b have substantially the same cross sectional area.

Each coil in an assembly has a current running through it which is in an opposite sense to the current running through the coil immediately next to it. For example, in assembly 30a, coil 31a has a current running through it in the opposite direction a current running through coil 33a. Coil 33a has a current running through it in the opposite direction a current running through coil 32a. The direction of current flow in coils 31a, 33a, 32a is indicated by arrows 34a, 36a, 35a respectively.

Similarly, in assembly 30b, the currents running through coil 31b is opposite to the current in coil 33b, which is opposite to the current in coil 32b. The direction of current flow in coils 31b, 33b, 32b is indicated by arrows 34b, 36b, 35b respectively.

The coil assemblies 30a, 30b are symmetrically disposed with respect to a reference plane X-Z. The reference plane is located approximately equidistant between the coil assemblies. The coil assemblies generate a primary magnetic field $\vec{B}$ in the area between the coil assemblies. The primary magnetic field $\vec{B}$ is in a plane corresponding to the reference plane and perpendicular to the head-foot axis of patient 15.

The coil assemblies also generate secondary magnet fields which are also parallel to and substantially coincident with the reference plane. The secondary fields function to compensate for inhomogeneity in the primary magnetic field $\vec{B}$.

As will be appreciated, further pairs of coils may be included in the magnetic coil assemblies, which would further improve the homogeneity of the primary magnetic field.

Advantageously the configuration of coils in FIG. 3 generates a stronger homogeneous magnetic field along the length of the patient 15 than is possible with known solenoid type systems. This allows for imaging along a greater length of the patient. For example, the entire spine of the patient may be imaged in a single scan.

Figure 4:
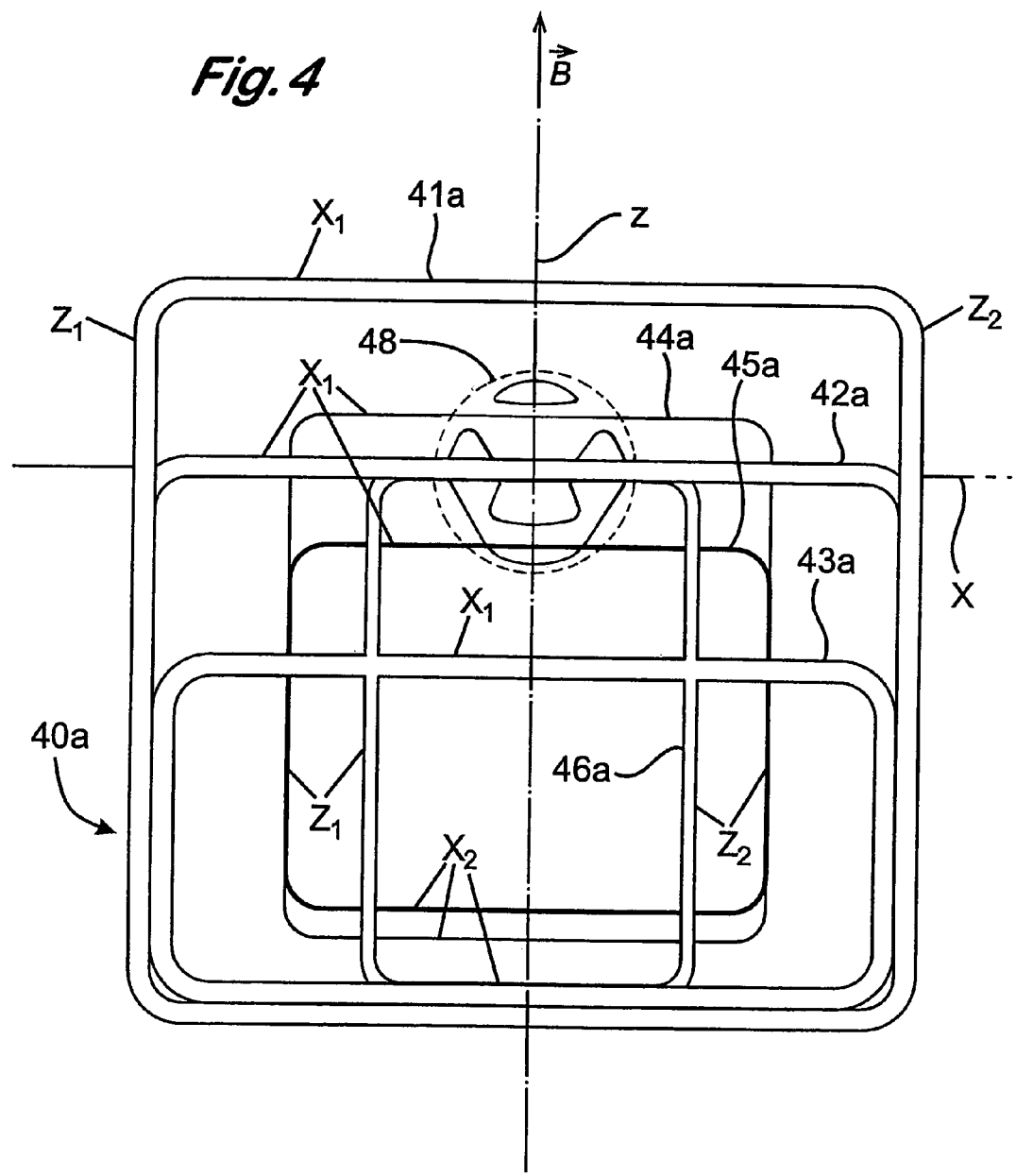
FIG. 4 is a plane view of an alternative embodiment of the improved access magnetic coil assembly shown in FIG. 3.

In FIG. 4 a single magnetic coil assembly 40a is shown comprising primary racetrack coils 41a, 42a, 43a and compensating racetrack coils 44a, 45a, 46a. The primary drive coils generate the primary magnetic field and secondary fields for compensating for inhomogeneity in the primary field. The compensating coils generate further fields which function to further improve the homogeneity of the primary magnetic field. The area in which the primary magnetic field is suitable for imaging is indicated by the sphere 48.

The magnetic fields generated by the $X_1$ arm of each racetrack coil are of primary importance to the imaging sphere 48 (shown by a dashed line). the return path of each racetrack coil, the $X_2$ arms, have an adverse effect on the homogeneity of the primary magnetic filed and are thus disposed at a great distance as possible from the imaging sphere. The $Z_1$ and the $Z_2$ arms of each racetrack coil do not contribute significantly to the primary magnetic field.

As will be appreciated by those skilled in the art, the distance at which the $X_2$ arms of the coils can be located from the $X_1$ arms will effect the overall size of the MRI system. Thus it is desirable to keep this distance to a minimum, while still maintaining a suitably homogenous primary magnet field. In an alternative embodiment, the $X_2$ arms of each coil in the top coil assembly are closer to the corresponding $X_2$ arms in the bottom coil assembly than the $X_1$ arms of the top and bottom coil assemblies. Advantageously, this further reduces the size of the MRI system.

Furthermore, the diameter and shape of each racetrack coil will effect the homogeneity of the primary magnetic field and thus can be varied in order to provide the most optimum configuration.

In a preferred embodiment of the present invention, the racetrack coils are superconducting coils and are housed within a cryostat.

Figure 5:
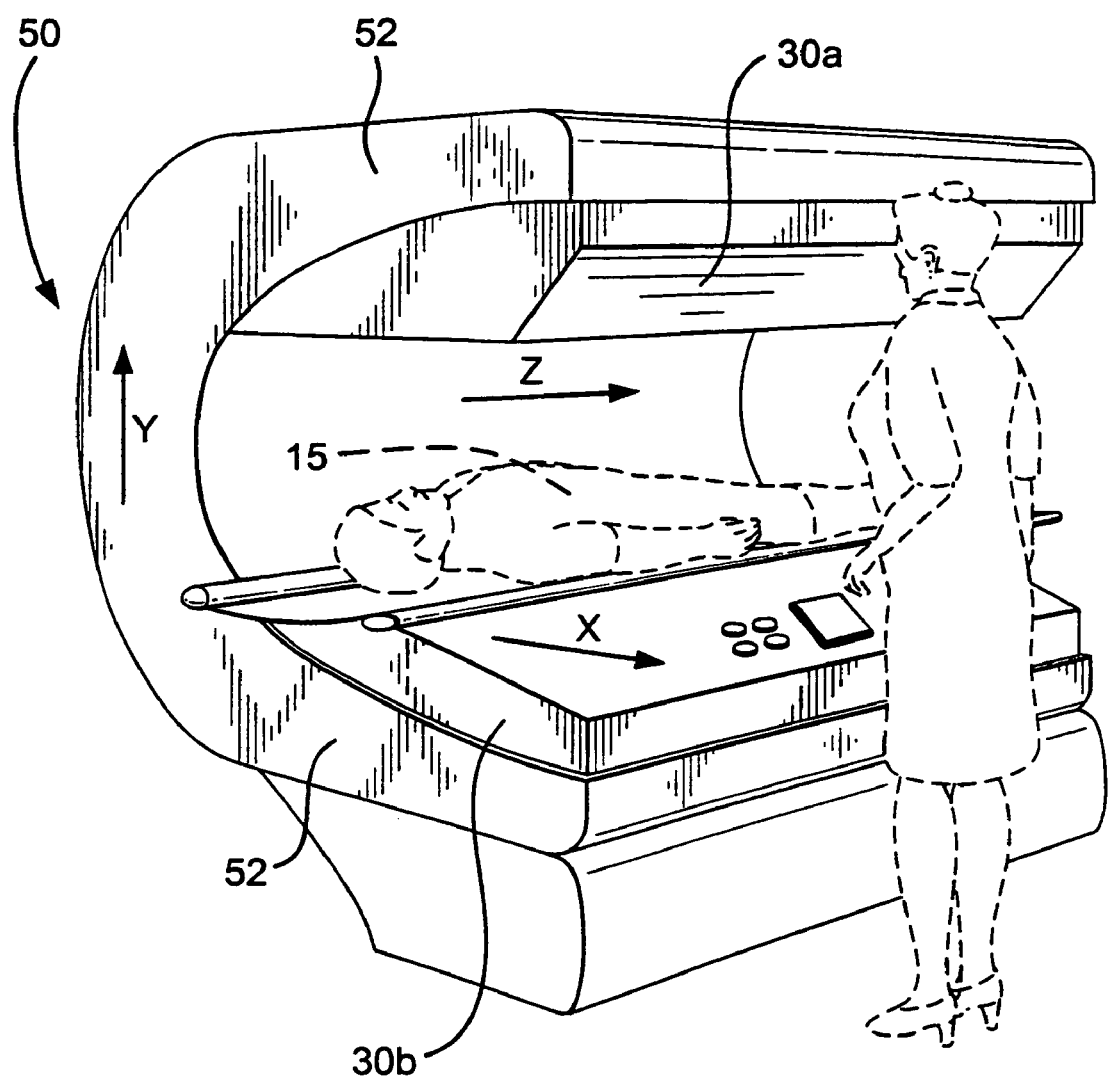
FIG. 5 is a MRI system incorporating the improved access magnetic coil assemblies shown in FIG. 3.

FIG. 5 shows a MRI system 50 incorporating the racetrack magnetic coil assemblies shown in FIG. 3. The pair of magnet assemblies 30a, 30b are disposed within cryostat structure 52. The patient 15 is positioned inside the MRI system 50. The primary magnetic field $\vec{B}$ is parallel to, and substantially coincident with, the reference plane X-Z and perpendicular to the head-foot axis of the patient.

Advantageously, the MRI system shown in FIG. 5 allows for the patient to be more readily positioned within the system. Furthermore, access to the patient is greatly increased allowing for the possibility of performing various medical procedures on the patient while he is still located within the MRI system.

As can be seen in FIG. 5, three sides of the MRI system are open. This results in less stress to the patient due to the claustrophic nature of known solenoid type systems.

Furthermore, the arrangement shown in FIG. 5 allows for the possibility of locating the pair of magnet assemblies 30a, 30b closer together in the vertical direction Y. As is well known in the art, the closer the drive coils are to each other, the more the overall size of each coil and the amount of conductor needed to make the coil can be reduced without adversely effecting the homogeneity of the primary magnetic field. Any reduction in overall coil size will advantageously reduce the size and cost of the MRI system.

As will be appreciated by those skilled in the art, various modifications may be made to the embodiment hereinbefore described without departing from the scope of the present invention.

The invention claimed is:

1. An MRI system comprising:
   a magnet assembly configured for generating a stationary magnetic field, the magnet assembly comprising:
      first and second substantially planar coil assemblies, each coil assembly comprising at least two drive coils;
      each drive coil in the first coil assembly, forming a respective pair of drive coils with a corresponding drive coil in the second coil assembly, each drive coil of each pair of drive coils being substantially planar and of a substantially same size and shape as the other of the respective pair, said drive coils in each pair of drive coils being substantially parallel to one another and substantially parallel to an intermediate reference plane, and being disposed approximately equidistant from, and symmetrically with respect to, the intermediate reference plane; wherein;
      each drive coil of each pair of drive coils is arranged in order to enable a current to flow therethrough, the current through a first drive coil of each respective pair being in an opposite sense to the current through a second drive coil of said respective pair, whereby, in each respective pair of drive coils, a first section of the first drive coil and a corresponding first section of the second drive coil generate a primary magnetic field extending within the intermediate reference plane; and in each respective pair of drive coils, a second section of the first drive coil, opposite to the first section of the first drive coil, and a corresponding second section of the second drive coil, opposite to the first section of the second drive coil constitute respective return paths of the first and second drive coils in said respective pair, and are disposed at a sufficient distance from the first sections of the drive coils that magnetic fields generated by the second sections do not substantially adversely affect the homogeneity of the primary magnetic field generated by the first sections.

2. The MRI system according to claim 1, wherein:
the drive coils in the first and second coil assemblies are located in a single plane;
each respective drive coil of the first coil assembly is arranged in order to carry a current in a respective first sense;
each respective drive coil of the second assembly is arranged in order to carry a current in a respective second sense, opposite to the respective first sense; and
each respective drive coil in each coil assembly is arranged in order to carry its current in a respective sense opposite to that of the current in each adjacent drive coil in the respective coil assembly.

3. An MRI apparatus as claimed in claim 2, wherein the first and second coil assemblies respectively further comprise first and second coils of a pair of compensating coils, each of said coils of said pair of compensating coils being substantially parallel to one another and substantially parallel to an intermediate reference plane, and being of a substantially same size and shape and disposed equidistant from, and symmetrically with respect to, the intermediate reference plane, and each compensating coil being arranged to enable a current to flow therethrough, the current through a first compensating coil of said pair being in an opposite sense to the current through a second compensating coil of said pair;
whereby a first section of the first compensating coil and a corresponding first section of the second compensating coil generate a compensating magnetic field within the intermediate reference plane; and
wherein a second section of the first compensating coil, opposite to the first section of the first compensating coil, and a corresponding second section of the second compensating coil, opposite to the first section of the second compensating coil, constitute respective return paths of the first and second compensating coils, respectively, and are disposed at a sufficient distance from the first sections of the compensating coils that magnetic fields generated by the second sections of the compensating coils do not substantially adversely affect the homogeneity of the primary magnetic field generated by the first sections of the drive coils.

4. An MRI apparatus as claimed in claim 3, wherein each drive coil of said pair of drive coils are racetrack shaped.

5. An MRI apparatus as claimed in claim 4, wherein each compensating coil of said pair of compensating coils are racetrack shaped.

6. An MRI apparatus as claimed in claim 5, wherein said drive coils and said compensating coils are superconducting coils.

7. An MRI apparatus as claimed in claim 6, wherein the magnet assembly comprises a plurality of pairs of compensating coils.

8. An MRI system comprising a magnet assembly configured for generating a stationary magnetic field, the magnet assembly comprising first and second substantially planar and mirror symmetrically disposed coil assemblies, wherein:
each coil assembly comprises a plurality of drive coils;
each drive coil in the first coil assembly forms a respective pair of drive coils with a corresponding drive coil in the second coil assembly;
each drive coil of each pair of drive coils is substantially planar and of a substantially same size and shape as the other of the respective pair;
the drive coils in each pair of drive coils are substantially parallel to one another and substantially parallel to an intermediate reference plane, and are disposed approximately equidistant from, and symmetrically with respect to, the intermediate reference plane;
the drive coils within each substantially planar coil assembly are nested within one another in a single plane of said coil assembly and have differing length and width dimensions;
each drive coil of each pair of drive coils is arranged in order to enable a current to flow therethrough;
the current through a first drive coil of each respective pair is in an opposite sense to the current through a second drive coil of said respective pair, whereby, in each respective pair of drive coils, a first section of the first drive coil and a corresponding first section of the second drive coil generate a primary magnetic field extending within the intermediate reference plane;
said first sections of each of said plurality of drive coils of each coil assembly are disposed in parallel, in substantially close proximity to each other;
in each respective pair of drive coils, a second section of the first drive coil, opposite to the first section of the first drive coil, and a corresponding second section of the second drive coil, opposite to the first section of the second drive coil constitute respective return paths of the first and second drive coils in said respective pair; and
said second sections of each of said plurality of drive coils are disposed at a distance from the first sections of the drive coils, which distance is sufficient so that magnetic fields generated by said return paths do not substantially adversely affect the homogeneity of the primary magnetic field generated by the first sections.

9. The MRI system according to claim 8, wherein:
each respective drive coil of the first coil assembly is arranged in order to carry a current in a respective first sense;
each respective drive coil of the second assembly is arranged in order to carry a current in a respective second sense, opposite to the respective first sense; and
each respective drive coil in each coil assembly is arranged in order to carry its current in a respective sense opposite to that of the current in each adjacent drive coil in the respective coil assembly.

10. An MRI apparatus as claimed in claim 9, wherein the first and second coil assemblies respectively further comprise first and second coils of a pair of compensating coils, each compensating coil of said pair of compensating coils being substantially parallel to one another and substantially parallel to an intermediate reference plane, and being of a substantially same size and shape and disposed equidistant from, and
symmetrically with respect to, the intermediate reference plane, and each arranged to enable a current to flow therethrough, the current through a first compensating coil of said pair being in an opposite sense to the current through a second compensating coil of said pair;

whereby a first section of the first compensating coil and a corresponding first section of the second compensating coil generate a compensating magnetic field extending within the intermediate reference plane; and wherein a second section of the first compensating coil, opposite to the first section of the first compensating coil, and a corresponding second section of the second compensating coil, opposite to the first section of the second compensating coil, constitute respective return paths of the first and second compensating coils, respectively, and are disposed at a sufficient distance from the first sections of the compensating coils that magnetic fields generated by the second sections of the compensating coils do not substantially adversely affect the homogeneity of the primary magnetic field generated by the first sections of the drive coils.

11. An MRI apparatus as claimed in claim 10, wherein each drive coil of said pair of drive coils are racetrack shaped.

12. An MRI apparatus as claimed in claim 11, wherein each compensating coil of said pair of compensating coils are racetrack shaped.

13. An MRI apparatus as claimed in claim 12, wherein said drive coils and said compensating coils are superconducting coils.

14. An MRI apparatus as claimed in claim 13, wherein the magnet assembly comprises a plurality of pairs of said compensating coils.

* * * * *